(12) United States Patent
Lin et al.

(10) Patent No.: US 11,682,692 B2
(45) Date of Patent: *Jun. 20, 2023

(54) HARD MASK LAYER BELOW VIA STRUCTURE IN DISPLAY DEVICE

(71) Applicant: Taiwan Semiconductor Manufacturing Co., Ltd., Hsin-Chu (TW)

(72) Inventors: Chia-Hua Lin, Hsin-Chu (TW); Hsun-Chung Kuang, Hsinchu (TW); Yu-Hsing Chang, Taipei (TW); Yao-Wen Chang, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 76 days.

This patent is subject to a terminal disclaimer.

(21) Appl. No.: 16/871,257

(22) Filed: May 11, 2020

(65) Prior Publication Data

US 2021/0265417 A1    Aug. 26, 2021

Related U.S. Application Data

(60) Provisional application No. 62/980,506, filed on Feb. 24, 2020.

(51) Int. Cl.
*H01L 27/15* (2006.01)
*H01L 33/60* (2010.01)
(Continued)

(52) U.S. Cl.
CPC .......... *H01L 27/156* (2013.01); *H01L 33/405* (2013.01); *H01L 33/60* (2013.01); *H01L 33/62* (2013.01); *H01L 2933/0066* (2013.01)

(58) Field of Classification Search
CPC .............. H01L 27/3248; H01L 27/156; H01L 27/3211; H01L 27/3213; H01L 27/3216;
(Continued)

(56) References Cited

U.S. PATENT DOCUMENTS 6,861,670 B1 * 3/2005 Ohtani ................ H01L 27/1248
257/E27.113
2011/0037073 A1    2/2011 Ahn et al.
(Continued)

FOREIGN PATENT DOCUMENTS

GB         2570580 A      7/2019
JP      2019179716 A     10/2019
KR     20080061675 A      7/2008

OTHER PUBLICATIONS

Williams et al. "Etch Rates for Micromachining Processing—Part II." Journal of Microelectromechanical Systems, vol. 12, No. 6, Dec. 2003.

(Continued)

*Primary Examiner* — Kevin Parendo
(74) *Attorney, Agent, or Firm* — Eschweiler & Potashnik, LLC

(57) ABSTRACT

In some embodiments, the present disclosure relates to a display device that includes a reflector electrode coupled to an interconnect structure. An isolation structure is disposed over the reflector electrode, and a transparent electrode is disposed over the isolation structure. Further, an optical emitter structure is disposed over the transparent electrode. A via structure extends from a top surface of the isolation structure to the reflector electrode and comprises an outer portion that directly overlies the top surface of the isolation structure. A hard mask layer is arranged directly between the top surface of the isolation structure and the outer portion of the via structure.

20 Claims, 9 Drawing Sheets

(51) Int. Cl.
H01L 33/40 (2010.01)
H01L 33/62 (2010.01)

(58) Field of Classification Search
CPC ....... H01L 27/3218; H01L 27/32–3293; H01L 31/405; H01L 31/60; H01L 51/5218; H01L 51/5271; H01L 2933/0016; H10K 59/12–129; H10K 59/13–1315; H10K 50/818; H10K 59/80518; H10K 50/856

See application file for complete search history.

(56) References Cited

U.S. PATENT DOCUMENTS

| | | | | |
|---|---|---|---|---|
| 2014/0061916 | A1* | 3/2014 | Saito | H01L 21/76885 257/751 |
| 2014/0078120 | A1* | 3/2014 | Lee | H01L 51/5253 345/204 |
| 2014/0113438 | A1* | 4/2014 | Usami | H01L 21/02592 438/482 |
| 2015/0129857 | A1* | 5/2015 | Lee | H01L 51/5206 257/40 |
| 2016/0035815 | A1 | 2/2016 | Nagasawa et al. | |
| 2017/0125500 | A1* | 5/2017 | Kim | H01L 27/1288 |
| 2018/0122878 | A1 | 5/2018 | Kim et al. | |
| 2019/0157627 | A1* | 5/2019 | Bae | H01L 27/1255 |
| 2019/0198819 | A1* | 6/2019 | Shin | H01L 27/322 |
| 2020/0027900 | A1* | 1/2020 | Ebihara | H10K 59/1213 |
| 2021/0028243 | A1* | 1/2021 | Yang | H01L 51/5044 |

OTHER PUBLICATIONS

Gelder et al. "The Etching of Silicon Nitride in Phosphoric Acid with Silicon Dioxide as a Mask." Journal of the Electro-Chemical Society: Solid-State Science Magazine, Aug. 1967.

Franssila, Sami. "Introduction to Microfabrication." Chapter 21.4: Etch Rate & Etch Stop. ISBN 9780470020562 Published Jan. 28, 2005.

* cited by examiner

HARD MASK LAYER BELOW VIA STRUCTURE IN DISPLAY DEVICE

REFERENCE TO RELATED APPLICATION

This application claims the benefit of U.S. Provisional Application No. 62/980,506, filed on Feb. 24, 2020, the contents of which are hereby incorporated by reference in their entirety.

BACKGROUND

Many modern day electronic devices, such as televisions and cellular devices, use image display devices to convert digital data into optical images. To achieve this, the image display device may comprise an array of pixel regions. Each pixel region may have an optical emitter structure and may be coupled to a semiconductor device. The semiconductor device may selectively apply an electrical signal (e.g., a voltage) to the optical emitter structure. Upon application of the electrical signal, the optical emitter structure may emit an optical signal (e.g., light). The optical emitter structure may, for example, be an organic light emitting diode (OLED) or some other suitable light emitting device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
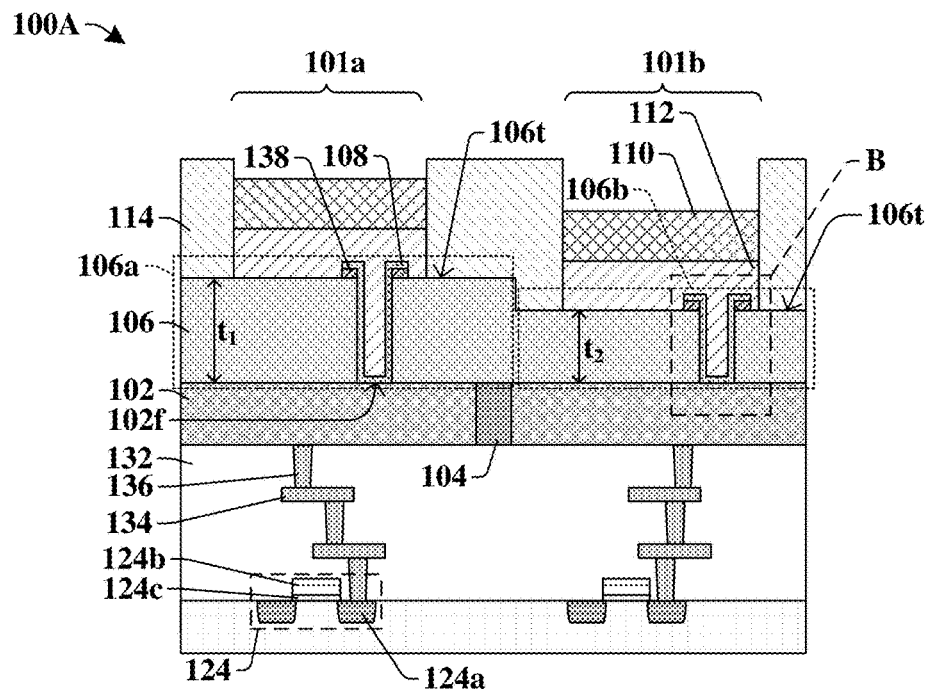
FIG. 1A illustrates a cross-sectional view of some embodiments of a display device having a hard mask layer arranged directly between a via structure and a topmost surface of an isolation structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A display device includes an array of pixel regions, wherein each pixel region comprises an isolation structure arranged between a reflector electrode and a transparent electrode. A via structure may extend though the isolation structure and electrically couple the reflector electrode to the transparent electrode. An optical emitter structure may be arranged over the transparent electrode. During operation of the display device, an electrical signal (e.g., voltage) may be applied to the reflector electrode and thus, the transparent electrode from control circuitry and cause light to be produced at the interface between the optical emitter structure and the transparent electrode (e.g., due to electron-hole recombination). The light may reflect off a top surface of the isolation structure and/or may travel through the isolation structure, reflect off of the reflector electrode, and travel back towards the top surface of the isolation structure. Due to constructive and/or destructive interference of a given wavelength of light at the top surface of the isolation structure, colored light according to the thickness and/or composition of the isolation structure may be emitted from a top surface of the optical emitter structure.

To form the via structure, a first conductive layer may be formed over the isolation structure. A first opening may be formed in the first conductive layer (e.g., a metal) and the isolation structure to expose a first surface of the reflector electrode. In some embodiments, a cleaning process, such as an argon sputtering process, is conducted to remove any residue (e.g., a metal oxide) on the first surface of the reflector electrode from the formation of the first opening. However, during the cleaning process, portions of the first conductive layer may degrade, become completely removed, and/or be redeposited in undesired areas on the isolation structure and/or reflector electrode, for example. Such effects of the first conductive layer during the cleaning process may be unpredictable and difficult to control. Because the upper surfaces of the isolation structure receive and reflect light, when the upper surfaces of the isolation structure are damaged, the light may scatter, which may cause the emitted light to be a different color and/or reduce the intensity of the emitted light, for example, thereby resulting in an unreliable display device.

Various embodiments of the present disclosure are directed towards a method of using a hard mask layer over an isolation structure during the forming of a via structure to prevent damage to the isolation structure of a display device. In some embodiments, a hard mask layer comprising a dielectric or semiconductor material such as for example, silicon or silicon nitride, is deposited over the isolation structure. A first opening extending through the hard mask layer and the isolation structure may be formed to expose a first surface of an underlying reflector electrode. In some embodiments, a cleaning process may be performed to remove any residue on the first surface of the reflector electrode formed during the formation of the first opening. In some embodiments, due to the composition of the hard mask layer, the hard mask layer may be stable under the cleaning process and effectively protect the isolation structure. For example, in some embodiments, during the cleaning process, the hard mask layer may have a substantially uniform etch rate by the cleaning process and/or may have a high resistance to removal by the cleaning process. After the cleaning process, in some embodiments, a conductive layer is formed over the hard mask layer and within the first opening, wherein the conductive layer may comprise a conductive material (e.g., a metal). In some embodiments, the conductive layer may be selectively removed using a first removal process comprising a first etchant to form a via structure, and portions of the hard mask layer that do not directly underlie the via structure may be selectively removed using a second removal process comprising a second etchant different than the first etchant. The second etchant removes the portions of the hard mask layer at a significantly higher rate (e.g., amount of material per time) than the isolation structure. Thus, as the hard mask layer is removed by the second removal process, damage by the second etchant to the isolation structure is mitigated, thereby improving the reliability of the final display device.

FIG. 1A illustrates a cross-sectional view 100A of some embodiments of a display device comprising a hard mask layer arranged directly between a via structure and an isolation structure.

The display device of the cross-sectional view 100A includes a first pixel region 101a and a second pixel region 101b. In other embodiments, the display device of the cross-sectional view 100A may include one pixel region (e.g., the first pixel region 101a) or more than the first and second pixel regions 101a, 101b. In some embodiments, each of the first and second pixel regions 101a, 101b are configured to emit a different color of light (e.g., red, green, blue) when subjected to an electrical signal (e.g., voltage), and the color of light depends on the thickness of the isolation structure 106. For example, in some embodiments, the first pixel region 101a may comprise a first portion 106a of the isolation structure 106 that has a first thickness $t_1$, and the second pixel region 101b may comprise a second portion 106b of the isolation structure 106 that has a second thickness $t_2$. In some embodiments, the isolation structure 106 may comprise silicon dioxide, silicon nitride, or some other material that has optical properties such that incident light may reflect as colored light due to constructive and/or destructive interference, and wherein the color of colored light is dependent on, for example, the thickness of the isolation structure 106. For example, in some embodiments, the isolation structure 106 comprises silicon dioxide, and the first thickness $t_1$ may correspond to green light, and the second thickness $t_2$ may correspond to blue light. It will be appreciated that the color of light may depend on features of the pixel regions (101a, 101b) other than the thickness of the isolation structure 106.

In some embodiments, the isolation structure 106 is arranged between a reflector electrode 102 and a transparent electrode 112. First barrier structures 104 may be arranged between portions of the reflector electrode 102 such that each pixel region (101a, 101b) comprises an electrically isolated portion of the reflector electrode 102. In some embodiments, an optical emitter structure 110 may be arranged over the transparent electrode 112. Further, in some embodiments, second barrier structures 114 may be arranged over the isolation structure 106 and between portions of the optical emitter structure 110 and the transparent electrode 112 to isolate the first and second pixel regions 101a, 101b from one another.

In some embodiments, the reflector electrode 102 may be coupled to control circuitry 120. For example, in some embodiments, the reflector electrode 102 is disposed over an interconnect structure 130 comprising a network of interconnect wires 134 and interconnect vias 136 embedded in an interconnect dielectric structure 132. In some embodiments, the interconnect structure 130 is arranged over a substrate 122 and coupled to semiconductor devices 124. In some embodiments, the semiconductor devices 124 may be, for example, metal oxide semiconductor field-effect transistors (MOSFETs) comprising source/drain regions 124a within the substrate 122 and a gate electrode 124b over the substrate 122. The gate electrode 124b may be separated from the substrate 122 by a gate dielectric layer 124c. The control circuitry 120 is configured to selectively supply an electrical signal (e.g., voltage) to each of the first and second pixel regions 101a, 101b to emit colored light as indicated by digital data.

In some embodiments, each of the first and second pixel regions 101a, 101b comprise a via structure 108 such that the electrical signal (e.g., voltage) may be supplied to the transparent electrode 112 and the optical emitter structure 110 from the control circuitry 120. The electrical signal (e.g., voltage) may, for example, cause electron-hole recombination between the transparent electrode 112 and the optical emitter structure 110 that produces light, and that light may reflect off of top surfaces 106t of the isolation structure 106 and/or travel through the isolation structure 106, reflect off of the reflector electrode 102 and exit through the top surfaces of the isolation structure 106. Due to constructive and/or destructive interference, colored light dependent on the thickness, material, and/or other feature of the isolation structure 106 is emitted.

In some embodiments, the via structure 108 extends from the top surface 106t of the isolation structure 106 and extends down towards a first surface 102f of the reflector electrode 102, thereby electrically coupling the reflector electrode 102 to the transparent electrode 112 in each pixel region (e.g., 101a, 101b). In some embodiments, the via structure 108 may directly overlie portions of the top surface 106t of the isolation structure 106; however, in some embodiments, a majority of the top surface 106t of the isolation structure 106 directly contacts the transparent electrode 112 in each pixel region (e.g., 101a, 101b). In some embodiments, the isolation structure 106 may comprise silicon dioxide, and the via structure 108 may comprise a conductive material, such as, for example, titanium nitride. It will be appreciated that other materials for the isolation structure 106 and the via structure 108 are also within the scope of this disclosure.

In some embodiments, a hard mask layer 138 is arranged directly between the via structure 108 and the top surface 106t of the isolation structure 106 such that the via structure 108 does not directly contact the top surface 106t of the isolation structure 106. The hard mask layer 138 may mitigate damage to the top surface 106t of the isolation structure 106 during various cleaning and removal process used to form the via structure 108. In such embodiments, the hard mask layer 138 may comprise a different material than the via structure 108 and the isolation structure 106 such that each of the hard mask layer 138, the via structure 108, and/or the isolation structure 106 may be selectively removed without damaging other features during the formation of the display device. In some embodiments, the hard mask layer 138 may comprise silicon or silicon nitride. For example, after the formation of the via structure 108, portions of the material of the hard mask layer 138 may be selectively removed from portions of the top surface 106t of the isolation structure 106 by an etchant that does not remove the isolation structure 106 during processing thereby protecting the isolation structure 106 and producing a more reliable display device.

Figure 1B:
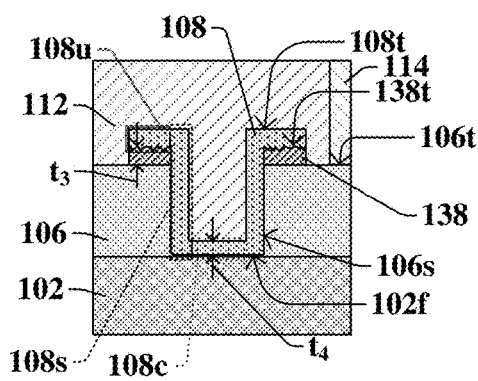
FIGS. 1B and 1C illustrate cross-sectional views of some alternative embodiments of the via structure and the hard mask layer of FIG. 1A.

FIG. 1B illustrates a cross-sectional view 100B of some embodiments of a via structure in a display device to highlight various features of the via structure and underlying hard mask layer. In some embodiments, the cross-sectional view 100B corresponds to box B of FIG. 1A.

In some embodiments, the via structure 108 may be described as comprising a center horizontal segment 108c contacting the first surface 102f of the reflector electrode 102, a sidewall vertical segment 108s contacting an inner sidewall 106s of the isolation structure 106, and an upper horizontal segment 108u directly overlying the top surface 106t of the isolation structure 106. The center horizontal segment 108c is connected to the upper horizontal segment 108u through the sidewall vertical segment 108s. In some embodiments, from the cross-sectional view 100B, there are two upper horizontal segments 108u separated from one another by the transparent electrode 112, and there are two sidewall vertical segments 108s separated from one another by the transparent electrode 112. In some embodiments, the upper horizontal segment 108u of the via structure 108 is spaced apart from the top surface 106t of the isolation structure 106 by the hard mask layer 138. The hard mask layer 138 does not overlie the first surface 102f of the reflector electrode 102, in some embodiments. In some embodiments, the hard mask layer 138 may have a third thickness $t_3$, and the via structure 108 may have a fourth thickness $t_4$. In some embodiments, the third thickness $t_3$ may be about equal to the fourth thickness $t_4$, whereas in other embodiments, the third thickness $t_3$ may be different than the fourth thickness $t_4$. In some embodiments, the third thickness $t_3$ may be in a range of between, for example, approximately 100 angstroms and approximately 700 angstroms. In some embodiments, the fourth thickness $t_4$ may be in a range of between, for example, approximately 100 angstroms and approximately 700 angstroms. It will be appreciated that other values for the third thickness $t_3$ and the fourth thickness $t_4$ are also within the scope of this disclosure.

In some embodiments, the hard mask layer 138 has a topmost surface 138t that has a first average surface roughness, and the via structure 108 has a topmost surface 108t that has a second average surface roughness. In some embodiments, because the hard mask layer 138 may be exposed to a cleaning process such as an argon sputtering or bombardment process while the via structure 108 is not yet formed, the first average surface roughness of the topmost surface 138t of the hard mask layer 138 is greater than the second average surface roughness of the topmost surface 108t of the via structure 108. In some embodiments, to measure average surface roughness, a roughness measurement tool (e.g., a profilometer, atomic force microscopy (AFM) tool) calculates a mean line along a surface and measures the deviation between the height of a peak or valley on the surface from the mean line. After measuring many deviations at many peaks and valleys throughout the surface, the average surface roughness is calculated by taking the mean of the many deviations, where the deviations are absolute values. In other embodiments, the surface roughness is quantified by measuring a total thickness variation (TTV). The TTV of a layer is the difference between the smallest thickness and the largest thickness of the layer. The TTV is measured throughout the length of a layer.

Figure 1C:
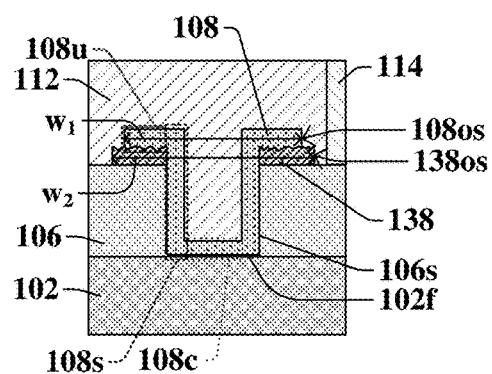

FIG. 1C illustrates a cross-sectional view 100C of some alternative embodiments of the via structure 108 and the hard mask layer 138 of FIG. 1B. Thus, in some embodiments, the cross-sectional view 100C may correspond to box B of FIG. 1A.

In some embodiments, the via structure 108 may have a first width $w_1$ measured between outermost sidewalls 108os of the via structure 108, wherein the first width $w_1$ may be a maximum width of the via structure 108. In some embodiments, the hard mask layer 138 may have a second width $w_2$ measured between outermost sidewalls 138os of the hard mask layer 138, wherein the second width $w_2$ may be a maximum width of the hard mask layer 138. In some embodiments, the first width $w_1$ may be less than the second width $w_2$ such that the outermost sidewalls 108os of the via structure 108 directly overlie the hard mask layer 138 while the outermost sidewalls 138os of the hard mask layer 138 do not directly underlie the via structure 108. In some other embodiments (not shown), the first width $w_1$ may be greater than the second width $w_2$ such that the outermost sidewalls 138os of the hard mask layer 138 directly underlie the via structure while the outermost sidewalls 108os of the via structure 108 do not directly overlie the hard mask layer 138. In yet some other embodiments, the first width $w_1$ may be about equal to the second width $w_2$ such that the outermost sidewalls 138os of the hard mask layer 138 directly overlie the outermost sidewalls 108os of the via structure 108. The first width $w_1$ may be different than the second width $w_2$ in some embodiments because during manufacturing, the via structure 108 is formed through a first removal process, and the hard mask layer 138 is formed through a second removal process different than the first removal process. Thus, the via structure 108 and the hard mask layer 138 are formed independently of each other, which may cause the first and second widths $w_1$, $w_2$ to vary from one another in some embodiments.

Figure 2:
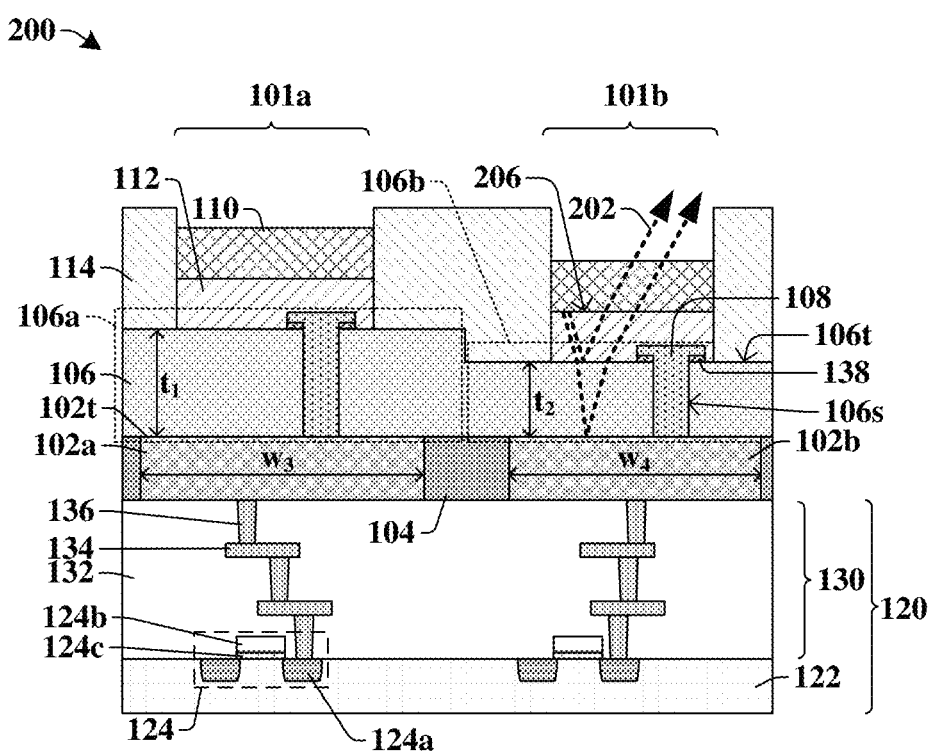
FIG. 2 illustrates a cross-sectional view of some additional embodiments of a display device comprising a hard mask layer directly between a via structure and a topmost surface of an isolation structure, as well as an example light path during operation of the display device.

FIG. 2 illustrates a cross-sectional view 200 of some alternative embodiments of a display device comprising a hard mask layer beneath a via structure and also an exemplary light path that is generated by the display device during operation.

In some embodiments, the via structure 108 may completely and continuously fill the space laterally between the inner sidewalls 106s of the isolation structure 106 in each pixel region (e.g., 101a, 101b). In such embodiments, the transparent electrode 112 does not extend below the top surface 106t of the isolation structure 106.

In some embodiments, the first pixel region 101a and the second pixel region 101b each comprise a reflector electrode (102 of FIG. 1A) having substantially equal widths. However, in other embodiments, as in the cross-sectional view 200 of FIG. 2, the first pixel region 101a may have a first reflector electrode portion 102a having a third width $w_3$, and the second pixel region 101b may have a second reflector electrode portion 102b having a fourth width $w_4$. In such embodiments, the third and fourth widths $w_3$, $w_4$ may be different from one another. For example, in some embodiments, the fourth width $w_4$ may be smaller than the third width $w_3$. In some embodiments, the smallest width (e.g., $w_4$) corresponds to the pixel region (e.g., 101b) that has a portion of an isolation structure 106 with a smallest thickness (e.g., $t_2$). Similarly, in some embodiments, the largest width (e.g., $w_3$) corresponds to the pixel region (e.g., 101a) that has a portion of an isolation structure 106 with a largest thickness (e.g., $t_1$). However, in other embodiments, the relationship between widths of the reflector electrode 102 does not have a correlation with the thicknesses of the isolation structure 106.

The cross-sectional view 200 also illustrates an exemplary first light path 202 in the second pixel region 101b. In some embodiments, light is generated at a first interface 206 between the optical emitter structure 110 and the transparent electrode 112 due to an electrical signal (e.g., voltage) applied to the reflector electrode 102 by the control circuitry 120. For example, in the cross-sectional view 200, the second pixel region 101b is "ON" (e.g., light is generated at the first interface 206), whereas the first pixel region 101a is "OFF" (e.g., light is not generated at the first interface 206). In the second pixel region 101b, the exemplary first light path 202 shows how in some embodiments, the generated light at the first interface 206 may reflect off of the top surface 106t of the second portion 106b of the isolation structure 106 and/or travel through the second portion 106b of the isolation structure 106, reflect off of the second reflector electrode portion 102b, and travel back up towards the top surface 106t of the second portion 106b of the isolation structure 106. Due to constructive and/or destructive interference, only a colored light having a first wavelength that is associated with the second thickness $t_2$ of the second portion 106b of the isolation structure 106 or associated with some other feature of the second pixel region 101b will be emitted/visible from a top surface of the optical emitter structure 110 in the second pixel region 101b. Thus, the control circuitry 120 may use digital data to selectively turn "ON" one or more of the pixel regions (e.g., 101a, 101b) to produce an optical image.

Further, it will be appreciated that in some other embodiments, a display device may comprise less than two pixel regions or more than two pixel regions, for example. In such embodiments, the control circuitry 120 may still use digital data to selectively turn "ON" one or more of the pixel regions in the display device to produce an optical image.

FIGS. 3-13 illustrate cross-sectional views 300-1300 of some embodiments of a method of forming a display device using a hard mask layer to mitigate damage to an isolation structure during formation of a via structure that extends through the isolation structure. Although FIGS. 3-13 are described in relation to a method, it will be appreciated that the structures disclosed in FIGS. 3-13 are not limited to such a method, but instead may stand alone as structures independent of the method.

Figure 3:
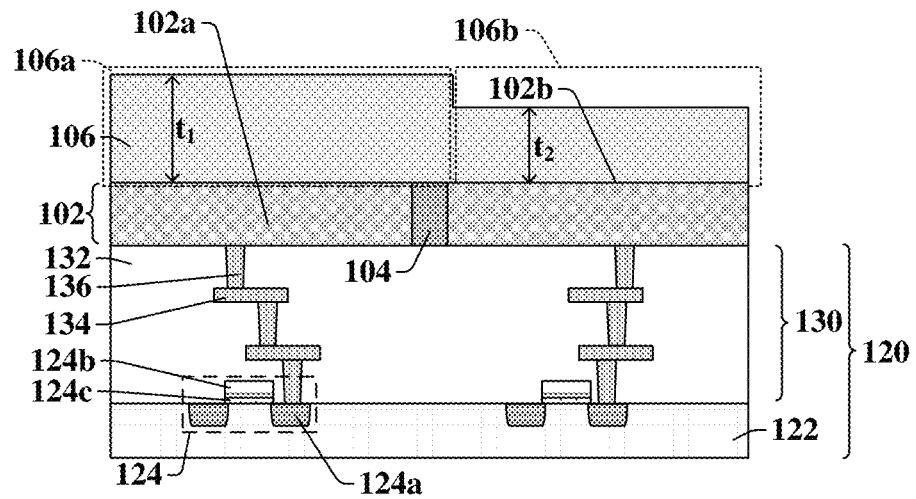
FIGS. 3-13 illustrate cross-sectional views of some embodiments of a method of forming a via structure over an isolation structure in a display device by using a hard mask layer between the via structure and the isolation structure to mitigate damage to the isolation structure.

As shown in the cross-sectional view 300 of FIG. 3, a reflector electrode 102 may be formed over control circuitry 120. In some embodiments, the control circuitry 120 may comprise an interconnect structure 130 arranged over a substrate 122. The interconnect structure 130 may comprise interconnect wires 134 and interconnect vias 136 embedded in an interconnect dielectric structure 132. In some embodiments, the interconnect wires and interconnect vias 134, 136 may comprise copper, tungsten, or the like. The interconnect structure 130 may couple the reflector electrode 102 to semiconductor devices 124 integrated on the substrate 122. In some embodiments, the semiconductor devices 124 may be or comprise metal oxide semiconductor field-effect transistors (MOSFETs), wherein the MOSFETs comprise source/drain regions 124a in the substrate 122. The semiconductor devices 124 may further comprise a gate electrode 124b arranged over a gate dielectric layer 124c on the substrate 122. It will be appreciated that other types of semiconductor devices 124 are also within the scope of this disclosure.

In some embodiments, the reflector electrode 102 may be separated by a first barrier structures 104 such that the reflector electrode 102 has a first reflector electrode portion 102a and a second reflector electrode portion 102b, for example. In some embodiments, the first barrier structures 104 comprise the same material as the interconnect dielectric structure 132. The reflector electrode 102 may comprise a metal that is both electrically conductive and optically reflective. For example, in some embodiments, the reflector electrode 102 may comprise aluminum or aluminum copper. In some embodiments, the first barrier structures 104 may be formed using a deposition process (e.g., physical vapor deposition (PVD), chemical vapor deposition (CVD), PE-CVD, atomic layer deposition (ALD), sputtering, etc.) followed by a patterning process (e.g., photolithography and etching). The reflector electrode 102 may then be formed over the interconnect dielectric structure 132 using a deposition process (e.g., physical vapor deposition (PVD), chemical vapor deposition (CVD), PE-CVD, atomic layer deposition (ALD), sputtering, etc.) followed by a patterning process (e.g., photolithography, etching, chemical mechanical planarization (CMP), etc.).

Further, an isolation structure 106 is formed over the reflector electrode 102. In some embodiments, the isolation structure 106 comprises a first portion 106a and a second portion 106b having a first thickness $t_1$ and a second thickness $t_2$, respectively. In some embodiments, the thicknesses ($t_1$, $t_2$) may be determined based the material of the isolation structure 106 and a predetermined light color to be emitted from each portion (106a, 106b) of the isolation structure 106. In some embodiments, the isolation structure 106 comprises a material that has optical properties, such that incident light may reflect as a colored light due to constructive and/or destructive interference, and wherein the color of the colored light is dependent on the thickness of the isolation structure 106. A non-limiting example of such a material include silicon dioxide. In other embodiments, the color of the colored light may be dependent on other features (e.g., composition, dimensions, etc.) of the isolation structure 106 or features (e.g., composition, dimensions, etc.) of the reflector electrode 102, for example. Further, each portion (106a, 106b) of the isolation structure 106 may be continuously connected to one another. In some embodiments, the formation of the isolation structure 106 may comprise steps of deposition processes (e.g., physical vapor deposition (PVD), chemical vapor deposition (CVD), PE-CVD, atomic layer deposition (ALD), sputtering, etc.) and patterning processes (e.g., photolithography/etching processes). In some embodiments, the first barrier structures 104 comprise the same material as the isolation structure 106. Further in some embodiments, the first barrier structures 104, the interconnect dielectric structure 132, and the isolation structure 106 comprise a same material. In other embodiments, the first barrier structures 104 and/or the interconnect dielectric structure 132 may comprise a dielectric material such as undoped silicate glass (USG), silicon nitride, or like. In some embodiments, the first and second thicknesses $t_1$, $t_2$ of the isolation structure 106 may each be in a range of between, for example, approximately 200 angstroms and approximately 1500 angstroms.

In other embodiments, it will be appreciated that the reflector electrode 102 may comprise more than two portions or less than two portions, and the isolation structure 106 may comprise more than two portions or less than two portions. For example, in some embodiments, to form a display device comprising one pixel region, the reflector electrode 102 may comprise the first reflector electrode portion 102a and not the second reflector electrode portion 102b. Further, in such embodiments, the isolation structure 106 may comprise the first portion 106a and not the second portion 106b.

Figure 4:
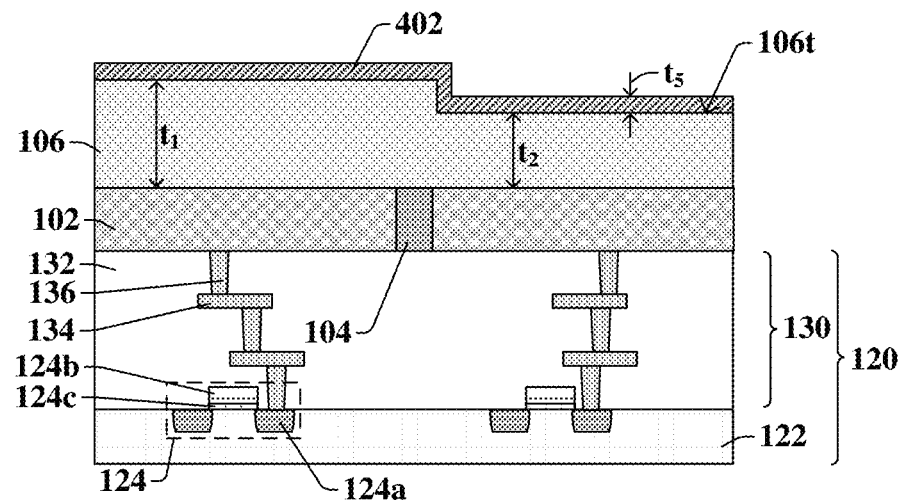

As shown in the cross-sectional view 400 of FIG. 4, in some embodiments, a conformal hard mask layer 402 is deposited over the isolation structure 106. In some embodiments, the conformal hard mask layer 402 has a fifth thickness is in a range of between, for example, approximately 100 angstroms and approximately 900 angstroms. The conformal hard mask layer 402 may be deposited by a deposition process (e.g., physical vapor deposition (PVD), chemical vapor deposition (CVD), PE-CVD, atomic layer deposition (ALD), sputtering, etc.). In other embodiments, the conformal hard mask layer 402 may be grown by an epitaxial growth process. In some embodiments, the conformal hard mask layer 402 may comprise a semiconductor and/or dielectric material. For example, in some embodiments, the conformal hard mask layer 402 comprises amorphous silicon or silicon nitride. The semiconductor and/or dielectric material of the conformal hard mask layer 402 has a substantially constant and thus, predictable and controllable removal rate during a cleaning process (see, 702 of FIG. 7) later used such that the conformal hard mask layer 402 may reliably protect the isolation structure 106 during the cleaning process (see, 702 of FIG. 7). Further, the fifth thickness is of the conformal hard mask layer 402 is thick enough to prevent the cleaning process (see, 702 of FIG. 7) from causing the top surfaces 106t of the isolation structure 106 to become exposed during the cleaning process (see, 702 of FIG. 7) later used.

Figure 5:
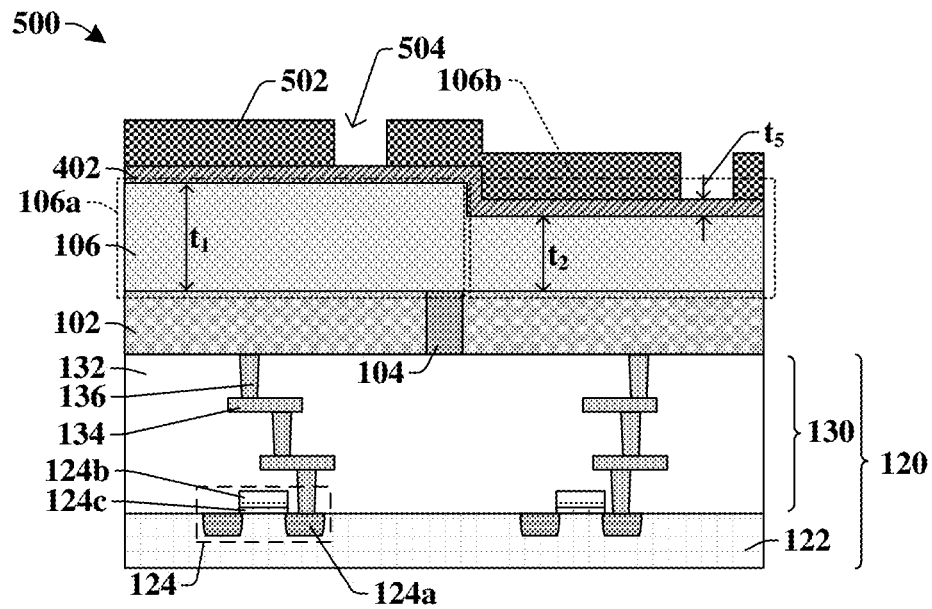

As shown in the cross-sectional view 500 of FIG. 5, in some embodiments, a first masking structure 502 may be formed over the conformal hard mask layer 402. The first masking structure 502 may comprise first openings 504. In some embodiments, each of the first openings 504 may be arranged over each portion (106a, 106b) of the isolation structure 106. In some embodiments, the first masking structure 502 may be formed by photolithography and may comprise a photosensitive material (e.g., photoresist) formed by a spin coating process. In such embodiments, the layer of photosensitive material is selectively exposed to electromagnetic radiation according to a photomask or photoreticle. The electromagnetic radiation modifies a solubility of exposed regions within the photosensitive material to define soluble regions. The photosensitive material is subsequently developed to define the first openings 504 within the photosensitive material by removing the soluble regions. In other embodiments, the first masking structure 502 may comprise a hard mask layer (e.g., a silicon nitride layer, a silicon carbide layer, or the like) patterned by, for example, a photolithography/etching process or some other suitable patterning process.

Figure 6:
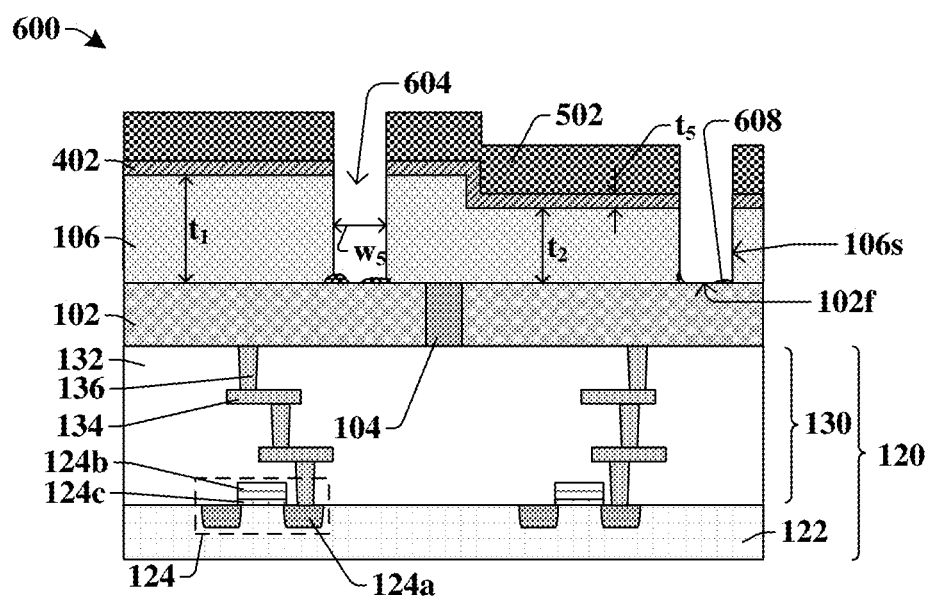

As shown in the cross-sectional view 600 of FIG. 6, an etching process may be performed to remove portions of the conformal hard mask layer 402 and the isolation structure 106 underlying the first openings (504 of FIG. 5) of the first masking structure 502, thereby forming second openings 604 in the isolation structure 106 and exposing first surfaces 102f of the reflector electrode 102. In some embodiments, the second openings 604 have a fifth width $w_5$ in a range of between, for example, approximately 0.1 micrometers and approximately 0.6 micrometers. Bottoms of the second openings 604 may be defined by the first surfaces 102f of the reflector electrode 102, and sidewalls of the second openings 604 may be defined by inner sidewalls 106s of the isolation structure 106. In some embodiments, the etching process is a dry etching process, and residue 608 is left behind on the first surfaces 102f of the reflector electrode 102. The residue 608 may comprise, for example, a metal oxide, comprising material of the isolation structure 106, the reflector electrode 102, and/or the conformal hard mask layer 402.

Figure 7:
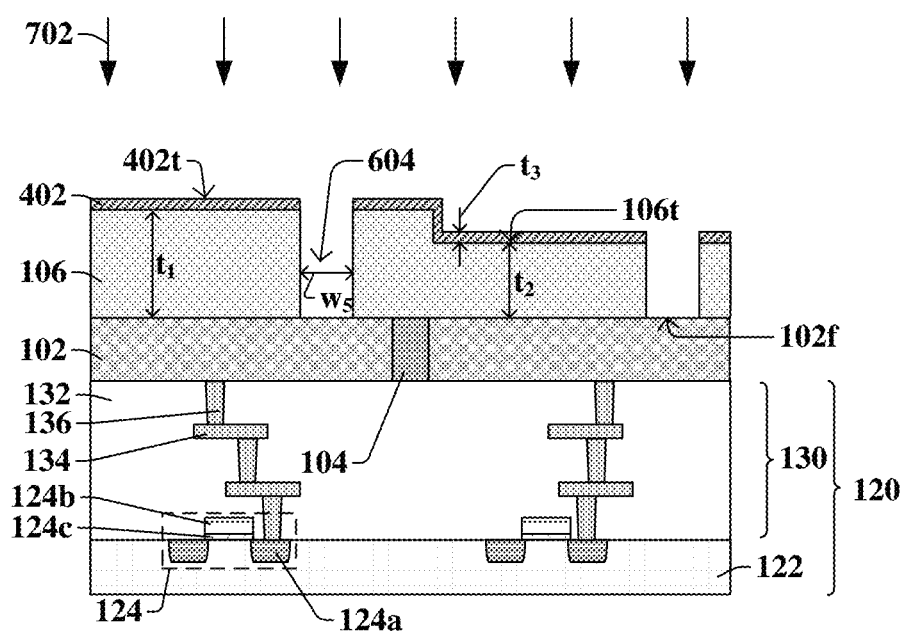

As shown in the cross-sectional view 700 of FIG. 7, the first masking structure (502 of FIG. 6) may be removed, and a cleaning process 702 may be performed over the isolation structure 106 to remove the residue (608 of FIG. 6) on the first surfaces 102f of the reflector electrode 102. Absent the cleaning process 702, electrical contact between a via structure (see, 108 of FIG. 10) to be formed and the first surface 102f which the via structure (see, 108 of FIG. 10) will be electrically coupled to may be poor (e.g., contact resistance may be high). In some embodiments, the cleaning process 702 may be or comprise an argon sputtering process. Thus, in some embodiments, the cleaning process 702 comprises a plasma gas (e.g., argon) that bombards the first surfaces 102f of the reflector electrode 102. As a result, in such embodiments, the plasma gas also bombards the conformal hard mask layer 402 which may increase the surface roughness of top surfaces 402t of the conformal hard mask layer 402 and reduce the thickness of the conformal hard mask layer 402. Therefore, in some embodiments, before the cleaning process 702, the conformal hard mask layer 402 may have the fifth thickness ($t_5$ of FIG. 6) and may have top surfaces having a third average surface roughness, whereas after the cleaning process 702, the conformal hard mask layer 402 may have a third thickness $t_3$ that is less than the fifth thickness ($t_5$ of FIG. 6) and may have top surfaces having a first average surface roughness that is greater than the third average surface roughness.

Because the conformal hard mask layer 402 comprises a semiconductor and/or dielectric material, the removal rate of the conformal hard mask layer 402 may be more predictable than if the conformal hard mask layer 402 comprised a metal. Thus, even though the cleaning process 702 may reduce the thickness of the conformal hard mask layer 402, the conformal hard mask layer 402 may still completely cover top surfaces 106t of the isolation structure 106 throughout the cleaning process 702, thereby protecting the top surfaces 106t of the isolation structure 106. Because the top surfaces 106t of the isolation structure 106 are used for the reflection of light (see, FIG. 2) during the operation of the display device, the prevention of damage (e.g., an increase in surface roughness, change in composition, etc.) to the top surfaces 106t of the isolation structure 106 by the conformal hard mask layer 402 is important to produce a reliable display device.

Further, in some embodiments, the cleaning process 702 is conducted in a plasma bombardment chamber. Materials removed during the cleaning process 702 may collect on inner sidewalls of the plasma bombardment chamber. Thus, in some embodiments, the plasma bombardment chamber needs to be cleaned periodically, which interrupts production. In some embodiments, the removal rate of a semiconductor and/or dielectric material during the cleaning process 702 may be less than a removal rate of a metal during the cleaning process 702 due to the semiconductor and/or dielectric materials being more stable under the cleaning process 702 than a metal material. Therefore, because the conformal hard mask layer 402 comprises a semiconductor and/or dielectric material, a smaller amount of the conformal hard mask layer 402 is removed during the cleaning process 702 than if the conformal hard mask layer 402 comprised a metal, and thus, the plasma bombardment chamber used for the cleaning process 702 does not need to be cleaned as frequently when the conformal hard mask layer 402 comprises a semiconductor and/or dielectric material than if the conformal hard mask layer 402 comprised a metal. In such embodiments, less frequent cleaning of the plasma bombardment chamber increases production of the final display device.

Figure 8:
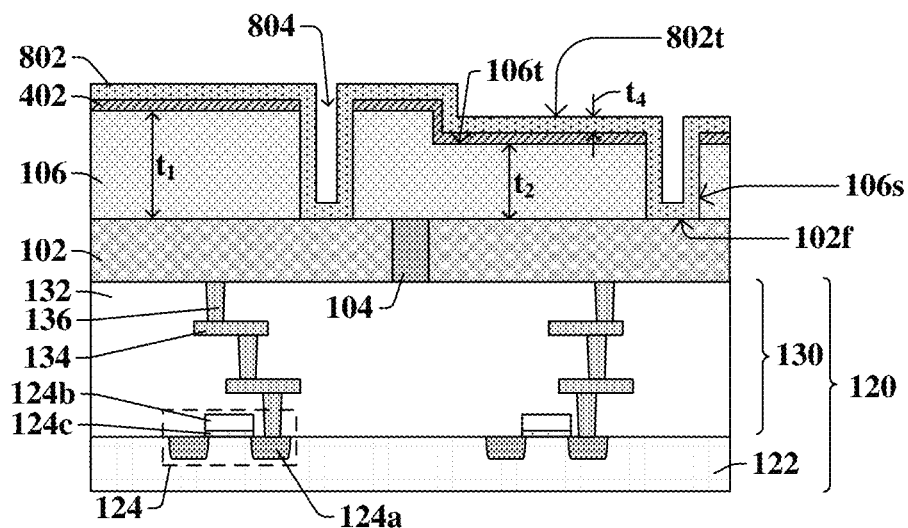

As shown in the cross-sectional view 800 of FIG. 8, a conductive layer 802 may be deposited over the conformal hard mask layer 402 and along the inner sidewalls 106s of the isolation structure 106 and the first surface 102f of the reflector electrode 102. In some embodiments, the conductive layer 802 has a fourth thickness $t_4$ in a range of between, for example, approximately 100 angstroms and approximately 700 angstroms. In other embodiments, the fourth thickness $t_4$ may be in a range of between, for example, approximately 100 angstroms and approximately 900 angstroms. In some embodiments, the conductive layer 802 may not completely fill the second openings (604 of FIG. 7), and thus, third openings 804 may remain between the inner sidewalls 106s of the isolation structure 106. In other words, two times the fourth thickness $t_4$ is less than the fifth width ($w_5$ of FIG. 7) of the second openings (604 of FIG. 7). In alternative embodiments, the conductive layer 802 may completely fill the second openings (604 of FIG. 7), such that the third openings 804 are not present (e.g., 108 of FIG. 2). Thus, in alternative embodiments, the fourth thickness $t_4$ may be greater than half of the fifth width ($w_5$ of FIG. 7) of the second openings (604 of FIG. 7). In such alternative embodiments, the conductive layer 802 may have upper surfaces with small indents that overlie the first surface 102f of the reflector electrode 102.

Further, in some embodiments, the conductive layer 802 may comprise a conductive metal, such as, for example, titanium nitride or tantalum nitride. Thus, in some embodiments, the conformal hard mask layer 402 and the conductive layer 802 comprise different materials. In some embodiments, the conductive layer 802 has top surfaces 802t that have a first average surface roughness that is less than the second average surface roughness of the conformal hard mask layer 402. The conductive layer 802 is completely spaced apart from the top surfaces 106t of the isolation structure 106 by the conformal hard mask layer 402.

Further, the conductive layer 802 may directly contact the first surface 102f of the reflector electrode 102 because of the removal of residue (608 of FIG. 8) by the cleaning process (702 of FIG. 7). The direct contact between the conductive layer 802 and the reflector electrode 102 allows for a reliable electrical connection. The conductive layer 802 may be deposited by a deposition process (e.g., physical vapor deposition (PVD), chemical vapor deposition (CVD), PE-CVD, atomic layer deposition (ALD), sputtering, etc.). Further, in some embodiments, to prevent the first surfaces 102f from oxidizing after the cleaning process (702 of FIG. 7) and before the formation of the conductive layer 802, the conductive layer 802 may be formed in-situ with the cleaning process (702 of FIG. 7). In other words, in some embodiments, a vacuum seal may not be broken between the cleaning process (702 of FIG. 7) and the formation of the conductive layer 802. For example, in some embodiments, the cleaning process (702 of FIG. 7) and the formation of the conductive layer 802 may be conducted in a same chamber, such as, for example, the plasma bombardment chamber. In other embodiments, the cleaning process (702 of FIG. 7) and the formation of the conductive layer 802 may be conducted in different chambers in a same mainframe such that the vacuum seal is not broken when transporting the substrate 122 between chambers.

Figure 9:
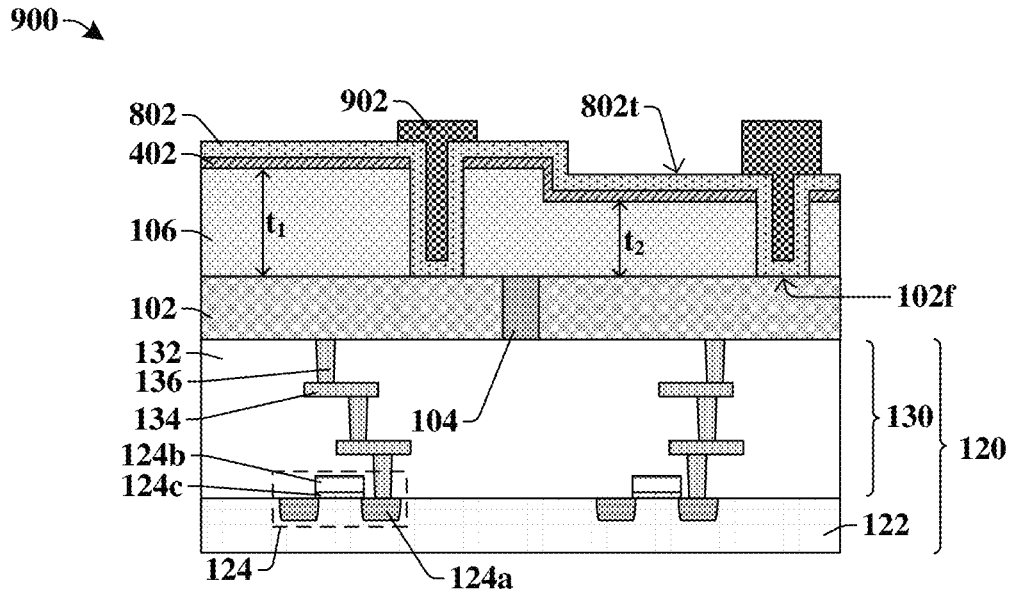

As shown in the cross-sectional view 900 of FIG. 9, a second masking structure 902 is formed over the conductive layer 802 and within the third openings (804 of FIG. 8). The second masking structure 902 may overlie portions of top surfaces 802t of the conductive layer 802. Further, the second masking structure 902 directly overlies the first surfaces 102f of the reflector electrode 102 that directly contact the conductive layer 802. It will be appreciated that second masking structure 902 may be formed by a similar photolithography process as used for the first masking structure 502 in FIG. 5.

Figure 10:
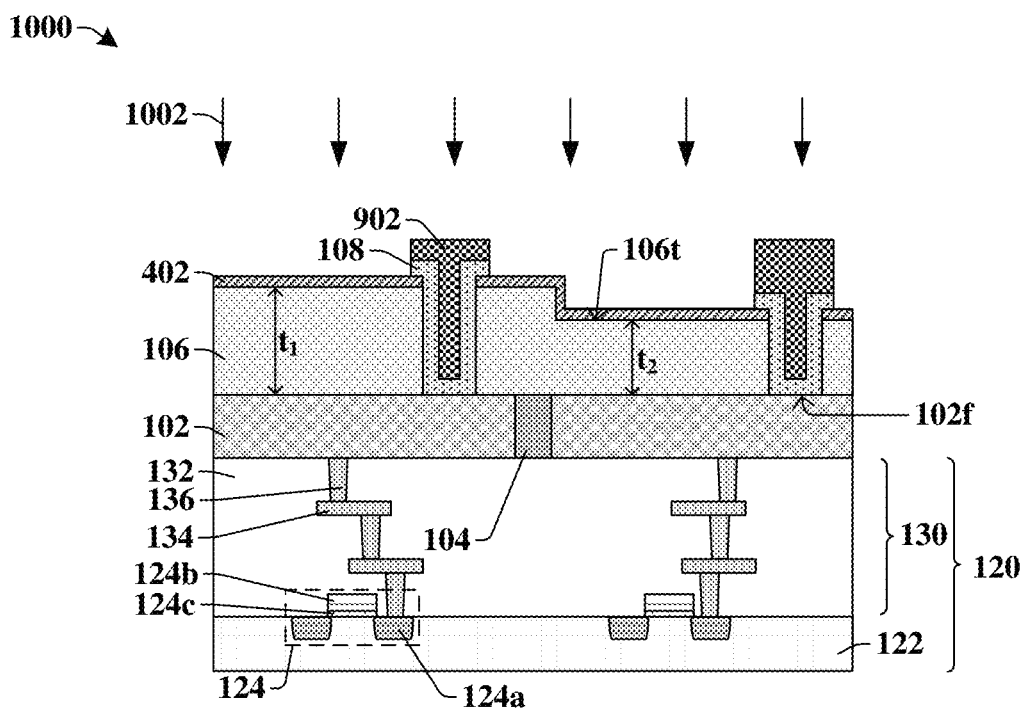

As shown in the cross-sectional view 1000 of FIG. 10, a first removal process 1002 may be performed to remove peripheral portions of the conductive layer (802 of FIG. 9) that do not directly underlie the second masking structure 902 thereby forming a via structure 108. In some embodiments, the via structure 108 extends completely through the isolation structure 106 to directly contact the first surface 102f of the reflector electrode 102. During the first removal process 1002, the conformal hard mask layer 402 may remain on the top surfaces 106t of the isolation structure 106 such that the first removal process 1002 does not damage the isolation structure 106.

In some embodiments, the first removal process 1002 comprises a wet etching process that utilizes a first wet etchant. The first wet etchant comprises a solution that is highly selective to removal of the conductive layer (802 of FIG. 9) but not to removal of the conformal hard mask layer 402. In such embodiments, during the first removal process 1002, as the conductive layer (802 of FIG. 9) is removed and the conformal hard mask layer 402 is exposed to the first wet etchant, the first wet etchant does not remove or removes only a small amount of the conformal hard mask layer 402. Thus, in some embodiments, the first removal process 1002 may comprise a first wet etchant that has a high selectivity ratio of the conductive layer (802 of FIG. 9) to the conformal hard mask layer 402. Further, in some embodiments, the first wet etchant also has a high selectivity ratio of the conductive layer (802 of FIG. 9) to the isolation structure 106 in case the isolation structure 106 does become exposed. In some embodiments, a selectivity ratio of a first material to a second material for an etchant is quantified by a ratio of an etch rate of the first material exposed to the etchant to an etch rate of the second material exposed to the etchant. Therefore, the higher a selectivity ratio is, the more likely and more quickly the first material will be removed by the etchant than the second material.

In some embodiments, for example, the first wet etchant of the first removal process 1002 may comprise hydrogen peroxide when the conductive layer (802 of FIG. 8) comprises titanium nitride. In such embodiments, the etch rate of the conductive layer (802 of FIG. 9) by hydrogen peroxide is greater than the etch rate of the conformal hard mask layer 402 by hydrogen peroxide. Further, in some embodiments, when the isolation structure 106 comprises silicon dioxide, the selectivity ratio of titanium nitride to silicon dioxide when using hydrogen peroxide, and thus, the selectivity ratio of the conductive layer (802 of FIG. 9) to the isolation structure 106 when using hydrogen peroxide may be greater than 2,000. Further, in such embodiments, the etch rate of silicon dioxide by hydrogen peroxide in an environment at a temperature between about 40 degrees Celsius and about 60 degrees Celsius may be substantially equal to 0 millimeters per minute. Thus, if the isolation structure 106 comprises silicon dioxide were to become exposed to the first wet etchant comprising hydrogen peroxide, the isolation structure 106 may not be removed and/or become damaged. It will be appreciated that other combination of materials and/or first wet etchants, wherein the first wet etchant is highly selective to the conductive layer (802 of FIG. 9) compared to the conformal hard mask layer 402 and the isolation structure 106 are also within the scope of the disclosure.

Figure 11:
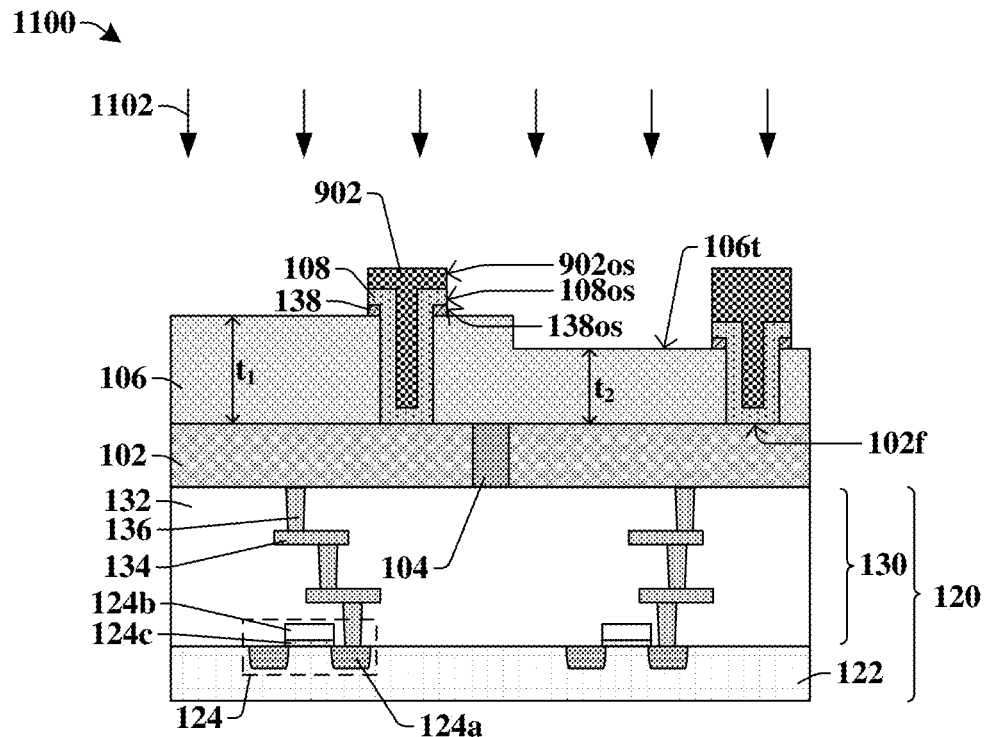

As shown in the cross-sectional view 1100 of FIG. 11, a second removal process 1102 may be performed to remove peripheral portions of the conformal hard mask layer (402 of FIG. 10) that do not directly underlie the second masking structure 902 to form a hard mask layer 138 arranged directly between the via structure 108 and the top surface 106*t* of the isolation structure 106. After the second removal process 1102, top surfaces 106*t* of the isolation structure 106 are exposed. In some embodiments, depending on the time of the first removal process (1002 of FIG. 10) and/or the time of the second removal process (1102), an outermost sidewall 902*os* of the second masking structure 902 may directly overlie an outermost sidewall 108*os* of the via structure 108 which may directly overlie an outermost sidewall 138*os* of the hard mask layer 138. In other embodiments, due to under-etching and/or over-etching, the outermost sidewall 902*os* of the second masking structure 902 may not directly overlie the outermost sidewall 108*os* of the via structure 108 which may not directly overlie the outermost sidewall 138*os* of the hard mask layer 138. In some embodiments, the second removal process 1102 does not remove and/or damage the isolation structure 106. For example, in some embodiments, prior to the second removal process 1102, the top surfaces 106*t* of the isolation structure 106 may have a third average surface roughness, and after the second removal process 1102, the top surfaces 106*t* of the isolation structure 106 may have a fourth average surface roughness that is about equal to the third average surface roughness. Thus, in some embodiments, the hard mask layer 138 directly contacts a portion of the top surface 106*t* of the isolation structure 106 that has about the same average surface roughness as other portions of the top surface 106*t* of the isolation structure 106 that are not in direct contact with the hard mask layer 138.

In some embodiments, removal and/or damage to the isolation structure 106 during the second removal process 1102 is mitigated because the second removal process 1102 may be or comprise a wet etching process that utilizes a second wet etchant. The second etchant is different than the first etchant of the first removal process (1002 of FIG. 10). The second wet etchant comprises a solution that is highly selective to removal of the conformal hard mask layer (402 of FIG. 10) by not to removal of the via structure 108 or the isolation structure 106. In such embodiments, during the second removal process 1102, as the conformal hard mask layer (402 of FIG. 10) is removed and the isolation structure 106 becomes exposed to the second etchant, the second etchant does not remove or removes only a small amount of the isolation structure 106. Similarly, during the second removal process 1102, the outermost sidewalls 108*os* of the via structure 108 are exposed to the second wet etchant. In such embodiments, the second wet etchant is highly selective to the removal of the conformal hard mask layer (402 of FIG. 10) and not the via structure 108 such that the second etchant does not remove or removes only a small amount of the via structure 108. In other words, the isolation structure 106 and the via structure 108 remain substantially unchanged during the second removal process 1102.

For example, in some embodiments, the second wet etchant of the second removal process 1102 may comprise tetramethylammonium hydroxide (TMAH) when the conformal hard mask layer (402 of FIG. 10) comprises amorphous silicon. In such embodiments, the etch rate of the conformal hard mask layer (402 of FIG. 10) by TMAH is greater than the etch rate of the isolation structure 106 by TMAH and is greater than the etch rate of the via structure 108 by TMAH. For example, in some embodiments, when the conformal hard mask layer (402 of FIG. 10) comprises amorphous silicon and the isolation structure 106 comprises silicon dioxide, the selectivity ratio of the conformal hard mask layer (402 of FIG. 10) to the isolation structure 106 when using TMAH may be greater than 2,000. Thus, the isolation structure 106 may remain substantially unchanged when exposed to TMAH.

For example, in some other embodiments, the second wet etchant of the second removal process 1102 may comprise phosphoric acid when the conformal hard mask layer (402 of FIG. 10) comprises silicon nitride. In such embodiments, the etch rate of the conformal hard mask layer (402 of FIG. 10) by phosphoric acid is greater than the etch rate of the isolation structure 106 by phosphoric acid and is greater than the etch rate of the via structure 108 by phosphoric acid. For example, in some embodiments, when the conformal hard mask layer (402 of FIG. 10) comprises silicon nitride and the isolation structure 106 comprises silicon dioxide, the selectivity ratio of the conformal hard mask layer (402 of FIG. 10) to the isolation structure 106 when using phosphoric acid at a high temperature (e.g., greater than 150 degrees Celsius) may be greater than 20. Thus, the isolation structure 106 may remain substantially unchanged when exposed to phosphoric acid.

It will be appreciated that other combination of materials and/or second wet etchants, wherein the second wet etchant is highly selective to the conformal hard mask layer (402 of FIG. 10) compared to the isolation structure 106 are also within the scope of the disclosure. Nevertheless, in some embodiments, the conformal hard mask layer (402 of FIG. 10) comprising a dielectric and/or semiconductor material may protect the isolation structure 106 during the cleaning process (702 of FIG. 7), and the conformal hard mask layer (402 of FIG. 10) may be removed from the isolation structure 106 to form the hard mask layer 138 without damaging the isolation structure 106, thereby improving the reliability of the display device.

Figure 12:
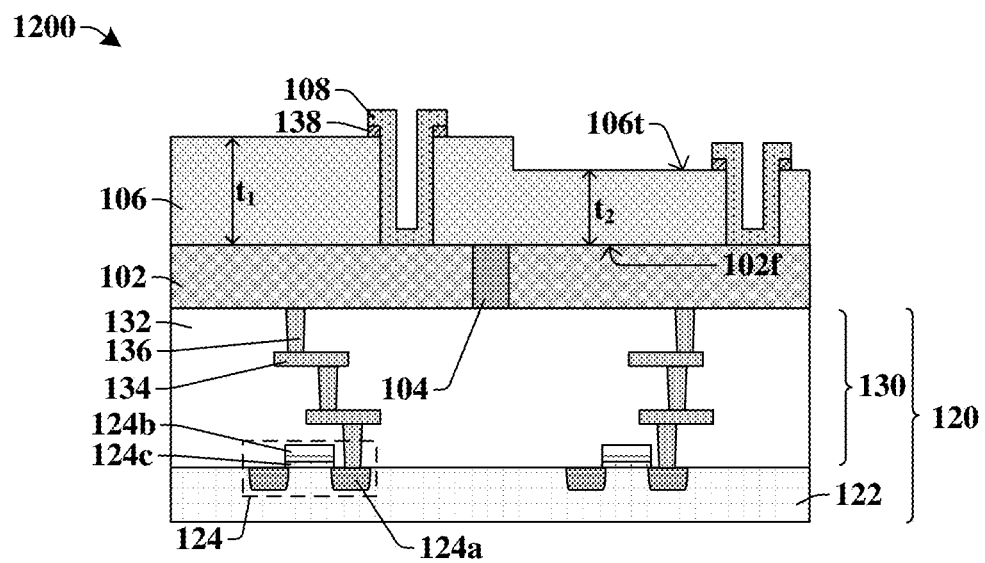

As shown in the cross-sectional view 1200 of FIG. 12, the second masking structure (902 of FIG. 11) is removed. In some embodiments, the second masking structure (902 of FIG. 11) is removed using a third wet etchant that does not remove and/or damage the via structure 108, the hard mask layer 138, and the isolation structure 106. Thus, the third wet etchant is different than the first etchant of the first removal process (1002 of FIG. 10) and is different than the second etchant of the second removal process (1102 of FIG. 11), in some embodiments.

Figure 13:
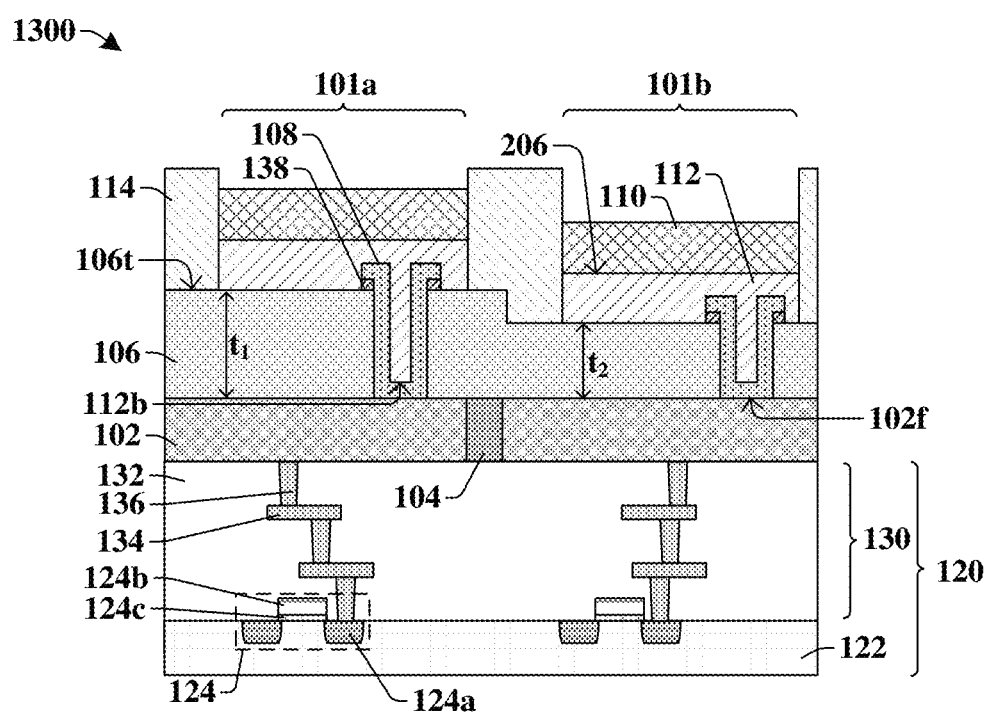

As shown in the cross-sectional view 1300 of FIG. 13, a transparent electrode 112, optical emitter structure 110, and second barrier structures 114 are formed over the isolation structure 106 and via structures 108. In some embodiments, the transparent electrode 112 has bottommost surfaces 112*b* that are below the top surfaces 106*t* of the isolation structure 106 because the transparent electrode 112 fills the third openings (804 of FIG. 8) of the via structures 108. The via structures 108 electrically couple the transparent electrode 112 to the reflector electrode 102. In some embodiments, the transparent electrode 112 may comprise an electrically conductive material that is also optically transparent, such as, for example, indium tin oxide (ITO), fluorine tin oxide (FTO), or the like. In some embodiments, the transparent electrode 112 may have a thickness that is, for example, in a range of between approximately 500 angstroms and approximately 3000 angstroms. In some embodiments, the optical emitter structure 110 may be or comprise an organic light emitting diode (OLED) or some other suitable light generating device. In some embodiments, the optical emitter structure 110 may have a thickness in the range of between, for example, approximately 500 angstroms and approximately 3000 angstroms.

In some embodiments, in order to generate light at a first interface 206 between the transparent electrode 112 and the optical emitter structure 110 during operation of the display device, the transparent electrode 112 and the optical emitter structure 110 may comprise different materials. Further, in some embodiments, the second barrier structures 114 may separate portions of the transparent electrode 112 and the optical emitter structure 110 to define a first pixel region 101a and a second pixel region 101b. It will be appreciated that the display device may comprise an array of pixel regions, and may comprise more or less than the first and second pixel regions 101a, 101b. Some of the second barrier structures 114 may directly overlie the first barrier structures 104, and the second barrier structures 114 may comprise a dielectric material to electrically and optically isolate the pixel regions (101a, 101b) from one another. For example, the second barrier structures 114 may comprise a nitride (e.g., silicon nitride, silicon oxynitride), an oxide (e.g., silicon oxide), or the like. For example, in some embodiments, the second barrier structures 114 may comprise a multi-layer film stack of silicon nitride and silicon oxide. Further, in some embodiments, the second barrier structures 114 may comprise a same material as the isolation structure 106, the first barrier structures 104, and/or the interconnect dielectric structure 132. The transparent electrode 112, the optical emitter structure 110, and the second barrier structures 114 may each be formed through various steps comprising deposition processes (e.g., physical vapor deposition (PVD), chemical vapor deposition (CVD), PE-CVD, atomic layer deposition (ALD), sputtering, etc.), removal processes (e.g., wet etching, dry etching, chemical mechanical planarization (CMP), etc.), and/or patterning processes (e.g., photolithography/etching).

Thus, the display device comprises control circuitry 120 to selectively operate the first and second pixel regions 101a, 101b. Because first surfaces 102f were cleaned by the cleaning process (702 of FIG. 7), the control circuitry 120 reliably send signals (e.g., voltage) to the transparent electrode 112. Further, because the hard mask layer 138 protected the isolation structure 106 from damage by the cleaning process (702 of FIG. 7), each of the pixel regions (101a, 101b) may reliably emit colored light depending on the thicknesses ($t_1$, $t_2$) of the isolation structure 106 and/or depending on other features (e.g., composition, dimensions, etc.) of the each of the pixel regions (101a, 101b) when operated by the control circuitry 120.

Figure 14:
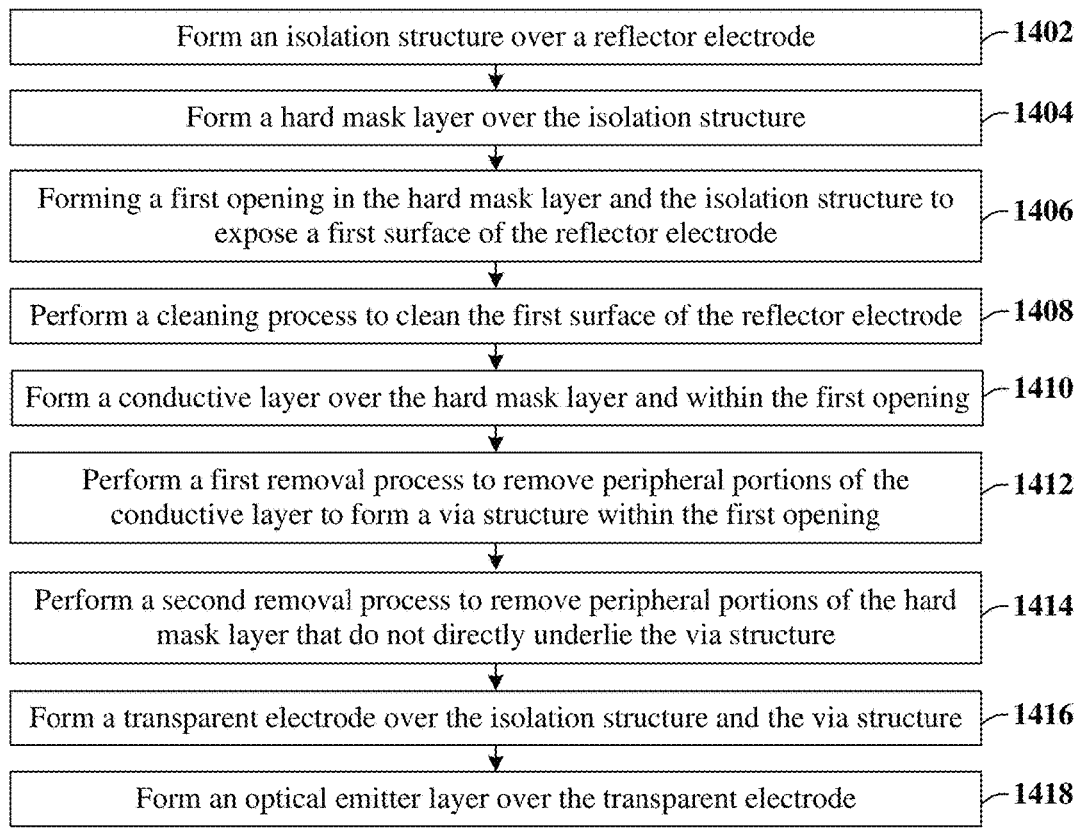
FIG. 14 illustrates a flow diagram of some embodiments corresponding to the method illustrated in FIGS. 3-13.

FIG. 14 illustrates a flow diagram of some embodiments of a method 1400 that corresponds to FIGS. 3-13.

While method 1400 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1402, an isolation structure is formed over a reflector electrode. FIG. 3 illustrates cross-sectional view 300 of some embodiments corresponding to act 1402.

At act 1404, a hard mask layer is formed over the isolation structure. FIG. 4 illustrates cross-sectional view 400 of some embodiments corresponding to act 1404.

At act 1406, a first opening is formed in the hard mask layer and the isolation structure to expose a first surface of the reflector electrode. FIG. 6 illustrates cross-sectional view 600 of some embodiments corresponding to act 1406.

At act 1408, a cleaning process is performed to clean the first surface of the reflector electrode. FIG. 7 illustrates a cross-sectional view 700 of some embodiments corresponding to act 1408.

At act 1410, a conductive layer is formed over the hard mask layer and within the first opening. FIG. 8 illustrates a cross-sectional view 800 of some embodiments corresponding to act 1410.

At act 1412, a first removal process is performed to remove peripheral portions of the conductive layer to form a via structure within the first opening. FIG. 10 illustrates cross-sectional view 1000 of some embodiments corresponding to act 1412.

At act 1414, a second removal process is performed to remove peripheral portions of the hard mask layer that do not directly underlie the via structure. FIG. 11 illustrates cross-sectional view 1100 of some embodiments corresponding to act 1414, At act 1416, a transparent electrode is formed over the isolation structure and the via structure.

At act 1418, an optical emitter layer is formed over the transparent electrode. FIG. 13 illustrates cross-sectional view 1300 of some embodiments corresponding to acts 1416 and 1418.

Therefore, the present disclosure relates to a display device comprising a hard mask layer arranged over a topmost surface of an isolation structure to mitigate damage to the isolation structure during the formation of a via structure that extends completely through the isolation structure. Thus, in some embodiments, during operation, the display device may reliably emit colored light.

Accordingly, in some embodiments, the present disclosure relates to a display device comprising: a reflector electrode coupled to an interconnect structure; an isolation structure disposed over the reflector electrode; a transparent electrode disposed over the isolation structure; an optical emitter structure disposed over the transparent electrode; a via structure extending from a top surface of the isolation structure to the reflector electrode and comprising an outer portion that directly overlies the top surface of the isolation structure; and a hard mask layer arranged directly between the top surface of the isolation structure and the outer portion of the via structure.

In other embodiments, the present disclosure relates to a display device comprising: an isolation structure disposed over a reflector electrode; a transparent electrode disposed over the isolation structure; an optical emitter structure disposed over the transparent electrode; a via structure extending from a top surface of the isolation structure to the reflector electrode and comprising an outer portion that directly overlies the top surface of the isolation structure; and a hard mask layer arranged directly between the top surface of the isolation structure and the outer portion of the via structure to completely separate the via structure from the top surface of the isolation structure, wherein the hard mask layer comprises a different material than the via structure and the isolation structure.

In yet other embodiments, the present disclosure relates to a method of forming a display device, the method comprising: forming an isolation structure over a reflector electrode; forming a hard mask layer over the isolation structure; forming a first opening extending through the hard mask layer and the isolation structure to expose a first surface of the reflector electrode, wherein inner sidewalls of the hard mask layer and the isolation structure define sidewalls of the first opening; performing a cleaning process to clean the first surface of the reflector electrode; forming a conductive layer over the hard mask layer, the sidewalls of the first opening, and the first surface of the reflector electrode; performing a first removal process to remove peripheral portions of the conductive layer to form a via structure that extends through the isolation structure and directly contacts the first surface of the reflector electrode; and performing a second removal process to remove peripheral portions of the hard mask layer to expose the isolation structure, wherein after the second removal process, the hard mask layer separates the via structure from a top surface of the isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A display device comprising:
a reflector electrode coupled to an interconnect structure;
an isolation structure disposed over the reflector electrode;
a transparent electrode disposed over the isolation structure;
an optical emitter structure disposed over the transparent electrode;
a via structure extending from a top surface of the isolation structure to the reflector electrode and comprising an outer portion that directly overlies the top surface of the isolation structure; and
a hard mask layer arranged directly between the top surface of the isolation structure and the outer portion of the via structure;
wherein the hard mask layer and the via structure form a pair of common sidewalls respectively on opposite sides of the via structure, and wherein the transparent electrode directly contacts each of the common sidewalls from top to bottom.

2. The display device of claim 1, wherein the via structure has a topmost surface that has a first average surface roughness, and wherein the hard mask layer has a topmost surface that has a second average surface roughness greater than the first average surface roughness.

3. The display device of claim 1, wherein the hard mask layer comprises silicon nitride, and wherein the via structure comprises a conductive metal.

4. The display device of claim 1, wherein the hard mask layer comprises amorphous silicon, and wherein the via structure comprises a conductive metal.

5. The display device of claim 1, wherein the via structure directly contacts a first surface of the reflector electrode, and wherein the hard mask layer does not directly overlie the first surface of the reflector electrode.

6. The display device of claim 1, wherein the top surface of the isolation structure has a first portion that directly contacts the hard mask layer and a second portion that directly contacts the transparent electrode, wherein the first portion of the top surface of the isolation structure has a first average surface roughness, wherein the second portion of the top surface of the isolation structure has a second average surface roughness, and wherein the first average surface roughness is about equal to the second average surface roughness.

7. The display device of claim 1, wherein a separation between the common sidewalls is equal to a maximum width of the via structure and a maximum width of the hard mask layer.

8. A display device comprising:
an isolation structure disposed over a reflector electrode;
a transparent electrode disposed over the isolation structure;
an optical emitter structure disposed over the transparent electrode;
a via structure extending from a top surface of the isolation structure to the reflector electrode and comprising an outer portion that directly overlies the top surface of the isolation structure; and
a hard mask layer arranged directly between the top surface of the isolation structure and the outer portion of the via structure to completely separate the via structure from the top surface of the isolation structure, wherein the hard mask layer comprises a different material than the via structure and the isolation structure;
wherein the top surface of the isolation structure has a first portion that directly contacts the hard mask layer and a second portion that directly contacts the transparent electrode, and wherein the via structure completely covers the hard mask layer.

9. The display device of claim 8, wherein the isolation structure comprises silicon dioxide, and wherein the hard mask layer comprises amorphous silicon or silicon nitride.

10. The display device of claim 8, wherein the via structure directly contacts the reflector electrode.

11. The display device of claim 8, wherein the via structure has a width at a top surface of the via structure, and wherein the width of the via structure is the same as a width of the hard mask layer.

12. The display device of claim 8, wherein the hard mask layer and the via structure form a pair of common sidewalls respectively on opposite sides of the via structure, and wherein the transparent electrode directly contacts each of the common sidewalls from top to bottom.

13. A display device comprising:
a reflector electrode coupled to an interconnect structure;
an isolation structure disposed over the reflector electrode;
a via structure extending from a top surface of the isolation structure to the reflector electrode and comprising an outer portion that directly overlies the top surface of the isolation structure;

a hard mask layer arranged directly between the top surface of the isolation structure and the outer portion of the via structure;

a transparent electrode disposed over the isolation structure, wherein a bottommost surface of the transparent electrode is arranged below the top surface of the isolation structure and directly contacts the via structure; and an optical emitter structure disposed over the transparent electrode;

wherein the isolation structure completely overlies a barrier structure, wherein a bottommost surface of the isolation structure directly contacts an upper surface of the reflector electrode, wherein the reflector electrode comprises a first portion and a second portion, and wherein the barrier structure is disposed laterally between the first and second portions of the reflector electrode.

14. The display device of claim 13, wherein the via structure has a first width that is a maximum width of the via structure, wherein the hard mask layer has a second width that is a maximum width of the hard mask layer, and wherein the first width is less than the second width.

15. The display device of claim 13, wherein the via structure has a topmost surface that has a first average surface roughness, and wherein the hard mask layer has a topmost surface that has a second average surface roughness greater than the first average surface roughness.

16. The display device of claim 13, wherein upper surfaces of the hard mask layer directly contact the via structure and the transparent electrode.

17. The display device of claim 13, wherein the isolation structure comprises silicon dioxide, and wherein the hard mask layer comprises amorphous silicon or silicon nitride.

18. The display device of claim 13, wherein the via structure comprises a different material than the hard mask layer.

19. The display device of claim 13, wherein the top surface of the isolation structure has a first portion that directly contacts the hard mask layer and a second portion that directly contacts the transparent electrode, wherein the first portion of the top surface of the isolation structure has a first average surface roughness, wherein the second portion of the top surface of the isolation structure has a second average surface roughness, and wherein the first average surface roughness is about equal to the second average surface roughness.

20. The display device of claim 13, wherein the transparent electrode has a bottom protrusion protruding to below the top surface of the isolation structure and directly contacting a pair of inner sidewalls of the via structure.

* * * * *